(12) United States Patent
Hailu et al.

(10) Patent No.: US 7,679,408 B2
(45) Date of Patent: Mar. 16, 2010

(54) GLITCHLESS CLOCK MULTIPLEXER OPTIMIZED FOR SYNCHRONOUS AND ASYNCHRONOUS CLOCKS

(75) Inventors: Eskinder Hailu, Austin, TX (US); Takeo Yasuda, Shiga (JP)

(73) Assignee: International Business Machines Corporation, Armonk, NY (US)

(*) Notice: Subject to any disclaimer, the term of this patent is extended or adjusted under 35 U.S.C. 154(b) by 55 days.

(21) Appl. No.: 11/960,832

(22) Filed: Dec. 20, 2007

(65) Prior Publication Data
US 2009/0160492 A1    Jun. 25, 2009

(51) Int. Cl.
*G06F 1/08* (2006.01)
(52) U.S. Cl. .................. 327/99; 327/407; 713/501
(58) Field of Classification Search .............. 327/99, 327/407; 713/501
See application file for complete search history.

(56) References Cited

U.S. PATENT DOCUMENTS

| | | | | |
|---|---|---|---|---|
| 5,448,597 A | * | 9/1995 | Hashimoto | .......... 375/354 |
| 5,623,223 A | * | 4/1997 | Pasqualini | .......... 327/298 |
| 6,239,626 B1 | * | 5/2001 | Chesavage | .......... 327/99 |
| 6,266,780 B1 | * | 7/2001 | Grundvig et al. | .......... 713/501 |
| 6,639,449 B1 | * | 10/2003 | De La Cruz et al. | .......... 327/407 |
| 7,039,146 B2 | * | 5/2006 | Chiu | .......... 375/373 |

* cited by examiner

*Primary Examiner*—Kenneth B. Wells
(74) *Attorney, Agent, or Firm*—Yee & Associates, P.C.; Matthew B. Talpis

(57) ABSTRACT

A circuit for switching clock signals with logic devices using a glitchless clock multiplexer optimized for synchronous and asynchronous clocks. The circuit comprises an asynchronous clock group and one or more synchronous clock group(s). The asynchronous group comprises a plurality of high frequency glitchless control (HFGC) blocks for asynchronous clock sources. Each synchronous group comprises a plurality of HFGC blocks for synchronous clock sources. The circuit comprises a multiplexer for receiving delayed input clock signals from HFGC blocks for asynchronous clock sources and from HFGC blocks for synchronous clock sources. A switching latency from a first input clock signal belonging to a synchronous group to a second input clock signal belonging to the same synchronous group is one clock cycle or less of the second input clock signal. Switching latency is the period in which no clock pulse appears at the final output of the circuit.

14 Claims, 11 Drawing Sheets

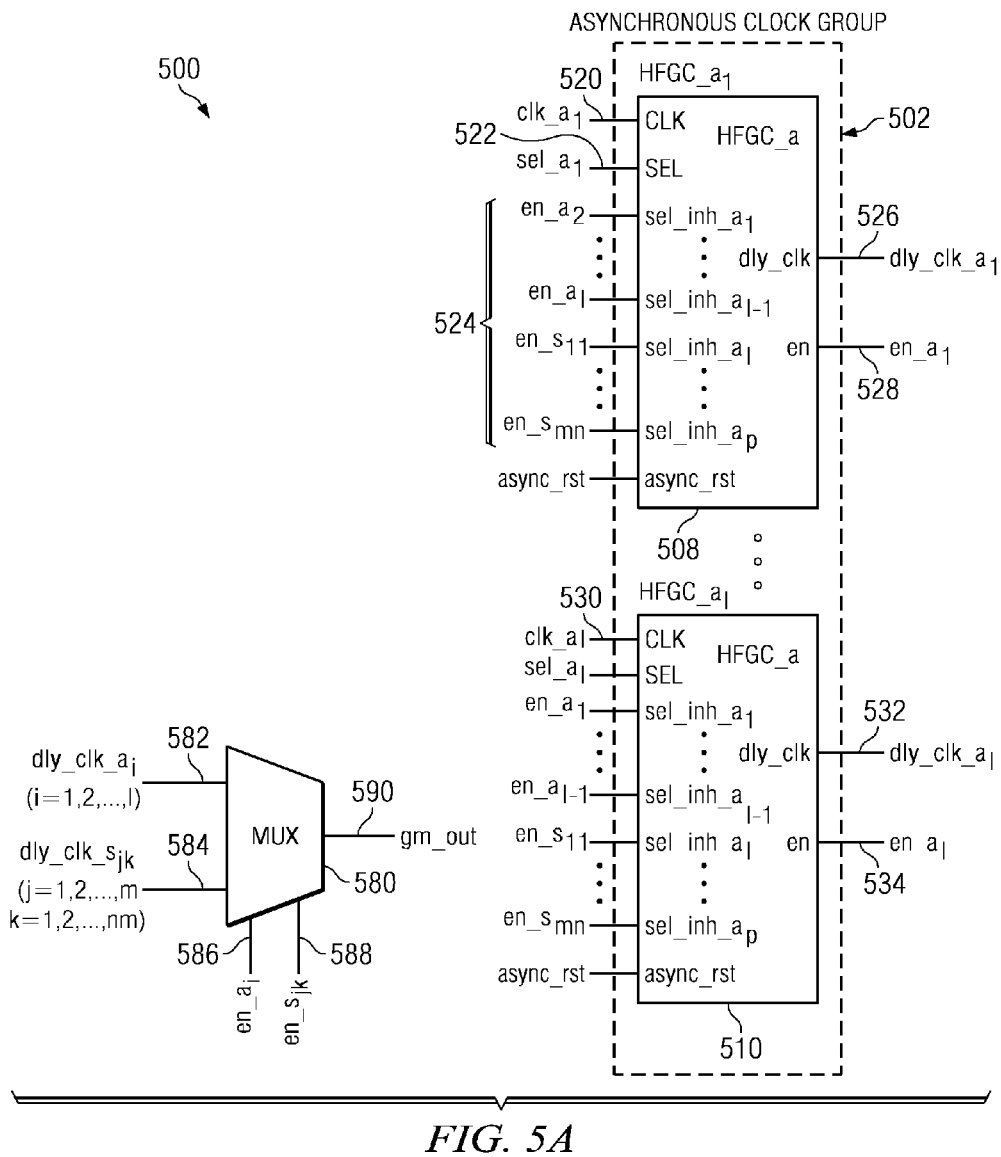
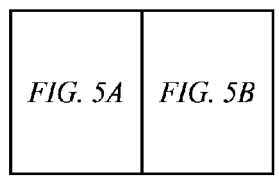
*FIG. 5A*
*FIG. 5*

GLITCHLESS CLOCK MULTIPLEXER OPTIMIZED FOR SYNCHRONOUS AND ASYNCHRONOUS CLOCKS

BACKGROUND OF THE INVENTION

1. Field of the Invention

The present invention relates generally to digital switching of clock signals in a computer system, and in particular to a method and system for switching signals with clock logic devices using a glitchless clock multiplexer optimized for synchronous and asynchronous clocks.

2. Description of the Related Art

Clocks are periodic signals used for timing alignment and synchronization in an integrated circuit device (also called a chip). With the recent system large scale integration (LSI), a chip will commonly have clocks comprising multiple frequencies. Clock selection from multiple clock sources is often used to implement several operation modes, such as high performance mode, low power mode, test evaluation mode, etc. When implementing clock selection, it is necessary to switch the source of the clock line while the chip is running. One method of switching the source of a clock line is through the use of a multiplexer. A multiplexer is a device that selects one input signal source from several input signal sources and passes that signal to the output.

One problem that can occur during a switch is that a glitch may be generated on the clock line. A glitch on the clock line occurs when the switching timing is not properly controlled during the switch, which can cause data integrity problems. A glitchless clock multiplexer (GM) is typically used for clock selection to prevent the occurrence of glitches in multiplexer outputs. However, eliminating glitches in the clock line can be difficult if the clock sources are totally asynchronous and the required switching latency is very short. The switching latency is the time required for a multiplexer to switch from one input clock signal to another input clock signal. If the input clock sources include clocks which are categorized into both synchronous clock groups and asynchronous clock groups, it is much harder to optimize the performance of the glitchless clock multiplexer while keeping the switching latency at a minimum.

SUMMARY OF THE INVENTION

The illustrative embodiments provide a computer implemented method and system for switching clock signals with logic devices using a glitchless clock multiplexer optimized for synchronous and asynchronous clocks. The circuit comprises an asynchronous clock group and one or more synchronous clock group(s). The asynchronous clock group comprises a plurality of glitchless control blocks for asynchronous clock sources. Each synchronous clock group comprises a plurality of glitchless control blocks for synchronous clock sources. The circuit also comprises a multiplexer for receiving delayed input clock signals from the glitchless control blocks for asynchronous clock sources and the glitchless control blocks for synchronous clock sources. A switching latency from a first input clock signal belonging to a synchronous clock group to a second input clock signal belonging to the same synchronous clock group is one clock cycle or less of the second input clock signal. The switching latency is defined as the period in which no clock pulse appears at the final output of the circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
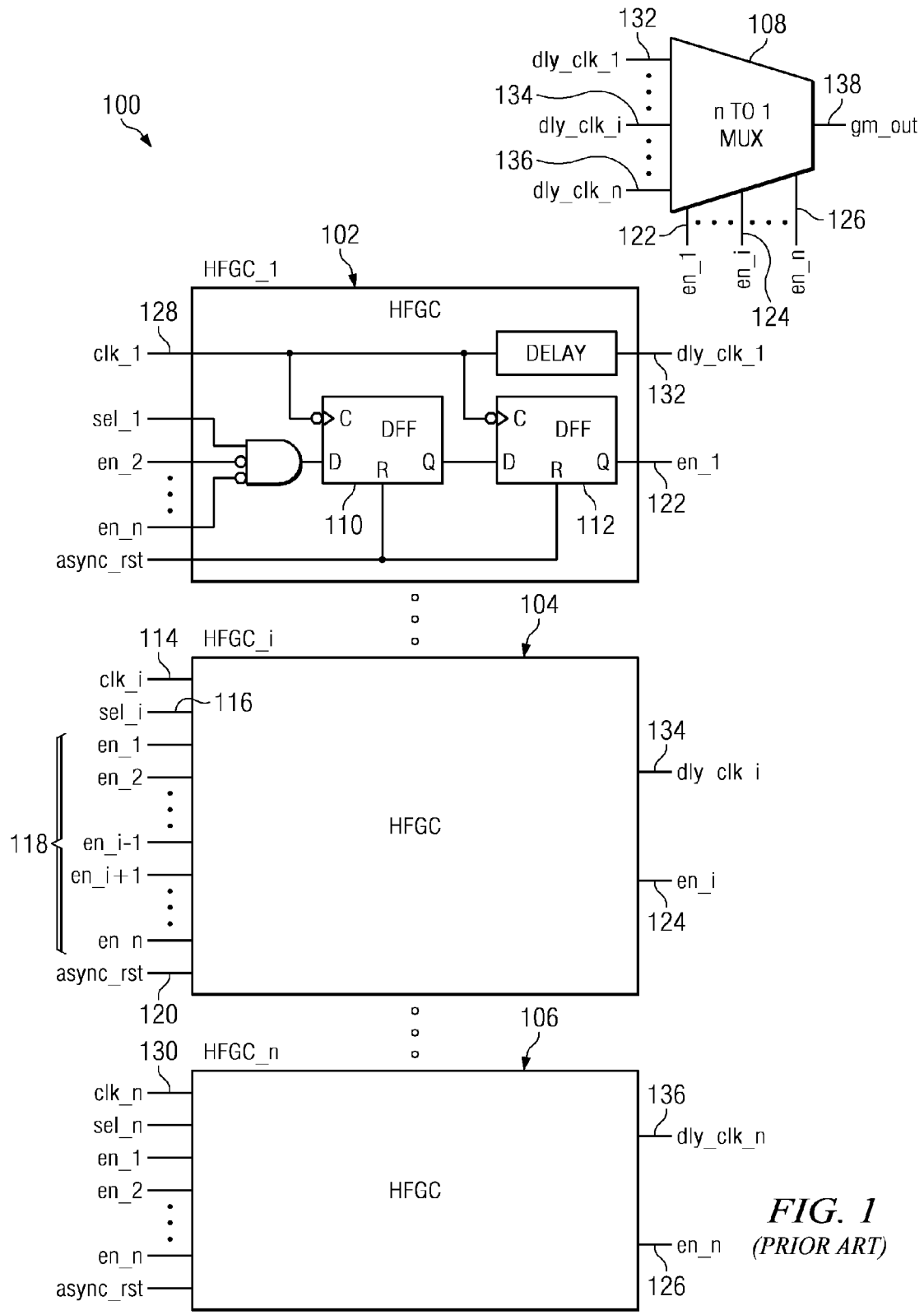
FIG. 1 is a circuit block diagram of a conventional glitchless clock multiplexer.

FIG. 1 is a circuit block diagram of a conventional glitchless clock multiplexer. As previously mentioned, a multiplexer is a device that selects one input clock source from several input sources and outputs the selected clock source into a single channel. Conventional glitchless clock multiplexer 100 allows for switching the source of the clock line, while avoiding a glitch on output clock line 138. The basic operation and requirement of conventional glitchless clock multiplexer 100 is to select one clock signal for output from two or more input clock sources.

In the conventional glitchless clock multiplexer 100 scheme shown in FIG. 1, clock switching is performed with high frequency glitchless control (HFGC) blocks. In this illustrative example, conventional glitchless clock multiplexer 100 comprises n high frequency glitchless control blocks, including HFGC_1 102, HFGC_i 104 and HFGC_n 106. The high frequency glitchless control blocks provide a delayed clock signal dly_clk_i (i=1, 2, . . . , n) (132, . . . , 134, . . . , 136) and enable signals en_j (i=1, 2, . . . , n) (122, . . . , 124, . . . , 126) to multiplexer (MUX) 108. Each high frequency glitchless control block includes master-slave D flip flops (DFFs). For example, HFGC_1 102 is shown to comprise two master-slave DFFs (DFF 110 and DFF 112). DFF 110 and DFF 112 have a reset input which resets DFF 110 and DFF 112 to the "zero" state at chip startup time so that none of the clock signals are propagated (none of the en__i signals (i=1, 2, . . . , n) are activated) initially. DFF 110 and DFF 112 are cascaded to minimize probability of a metastable state occurrence, which may be caused by capturing a DFF's input signal with asynchronous clock signals. A metastable state may occur when a clock signal and input of the DFF change simultaneously.

Each high frequency glitchless control block receives a clock signal, a select signal, several enable signals, and an asynchronous reset signal as its input signals. For example, HFGC_i 104 receives clock signal clk_i 114, select signal sel_i 116, enable signals en_1, en_2, en_i−1, en_i+1, . . . , en_n 118, and asynchronous reset signal async_rst 120. The clk_i 114 signal is supplied to the clock input of HFGC_i 104. Enable signal en_i 124 is generated using external clock switching request sel_i 116 and an enable signal en_j 118 (j being any enable signal number except i). In a similar manner, enable signals are generated at other HFGC blocks, including enable signal en_1 122 generated at HFGC_1 102, and enable signal en_n 126 generated at HFGC_n 106. The enable signals such as en_i 124 are used at MUX 108 for selecting one of the delayed clock signals as output clock line gm_out 138 of conventional glitchless clock multiplexer 100.

In addition, all clock signals in each high frequency glitchless control block are delayed appropriately before they are supplied to MUX 108. For instance clk_1 128, clk_i 114, and clk_n 130 are delayed prior to being supplied to MUX 108 in HFGC_1 102, HFGC_i 104 and HFGC_n 106, respectively. These delayed clock signals are used in order to ensure anonglitch multiplexer output. The delayed clock signals for clk_1 128, clk_i 114, and clk_n 130 are delayed to generate dly_clk_1 132, dly_clk_i 134, and dly_clk_n 136, respectively. The enable signal en_1 122, en_i 124 and en_n 126 are supplied as select signals for dly_clk_1 132, dly_clk_i 134 and dly_clk_n 136, respectively. These select signals select one of the clocks at MUX 108 to generate an output clock line gm_out 138. Output clock line gm_out 138 is an output comprising one of the delayed clock signals selected by MUX 108. Thus, if the enable signals for the other clocks are activated, the corresponding clock signal selected by MUX 108 will be on output clock line gm_out 138.

Figure 2:
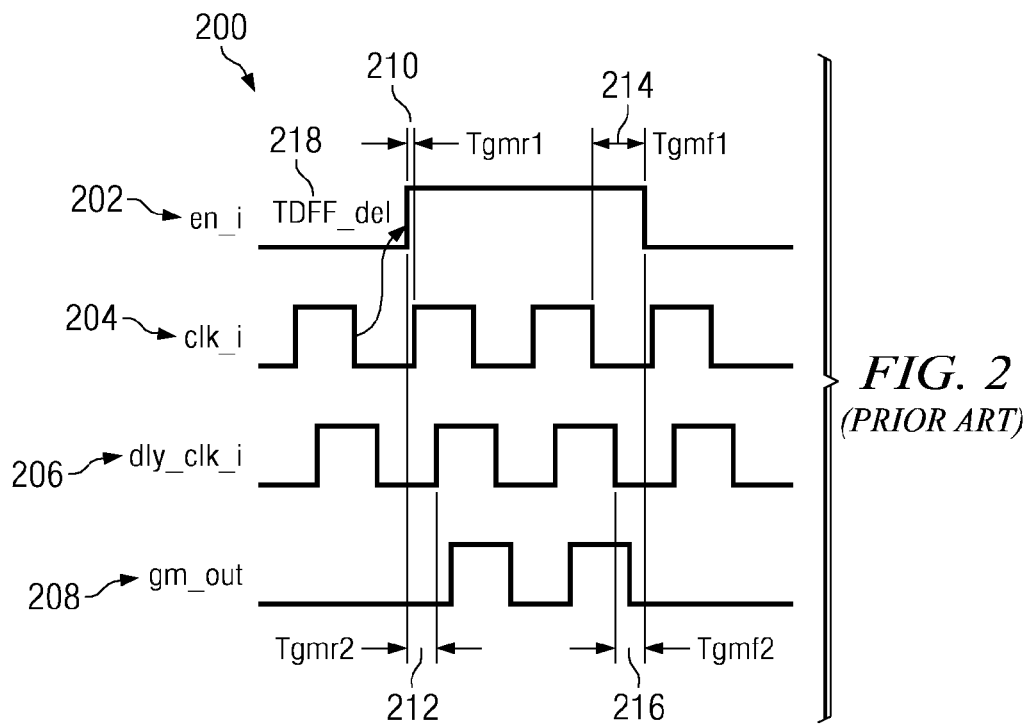
FIG. 2 illustrates a timing diagram which shows gating margin in a conventional glitchless clock multiplexer.

FIG. 2 illustrates a timing diagram 200 which shows gating margins in the conventional glitchless clock multiplexer 100 in FIG. 1. In FIG. 1, each delayed clock signal, such as dly_clk_i 134 signal, is assured to have enough gating margins against en_i 124 signal in order not to generate a partial clock signal at output clock line gm_out 138. A gating margin Tgmr1 210 is defined as the period between the rising edge of en_i 202 and the following rising edge of clk_i 204. Another gating margin Tgmr2 212 is defined as the period between the rising edge of en_i 202 and the following rising edge of dly_clk_i 206. Gating margins Tgmr1 210 and Tgmr2 212 are rising gating margins. As for falling gating margins, Tgmf1 214 and Tgmf2 216 are defined using falling edge of en_i 202, clk_i 204, and dly_clk_i 206 shown in FIG. 2. Gating margin Tgmf1 214 is defined as the period between the falling edge of en_i 202 and the previous falling edge of clk_i 204. Gating margin Tgmf2 216 is defined as the period between the falling edge of en_i 202 and the previous falling edge of dly_clk_i 206. Because en_i 202 signal is generated from the falling edge of clk_i 204 signal with the delay of DFF TDFF_del 218 at the HFGC blocks in conventional glitchless clock multiplexer 100 in FIG. 1, Tgmr1 210 is the smallest of all gating margins (Tgmr1 210, Tgmr2 212, Tgmf1 214, and Tgmf2 216). To get enough gating margin, dly_clk_i 206 which has a gating margin of Tgmr2 212 and Tgmf2 216 is generated and used to generate gm_out 208 signal. To implement the n to 1 MUX 108 shown in FIG. 1, multiple NAND gates are used.

Figure 3:
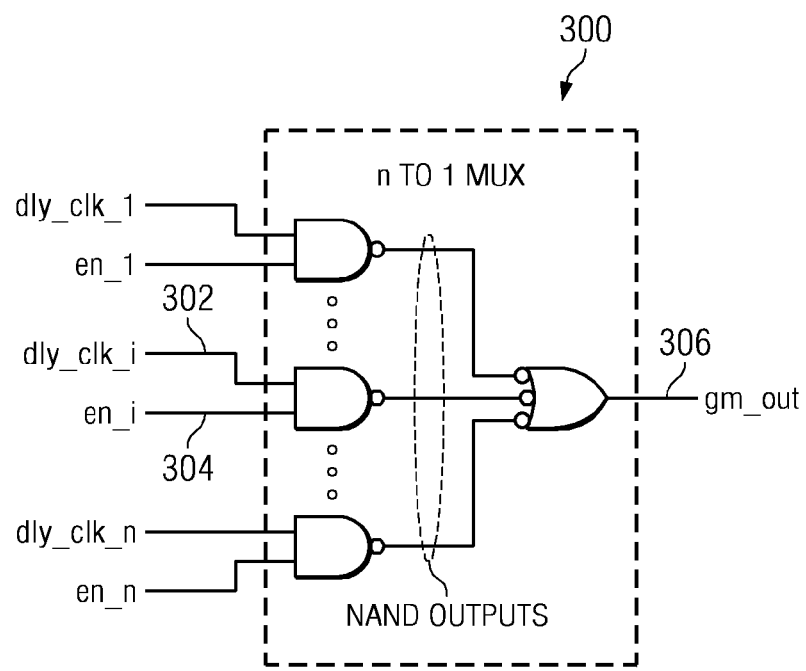
FIG. 3 illustrates a circuit block diagram of an n to 1 multiplexer which is used in both the conventional glitchless multiplexer and also the proposed glitchless multiplexer.

FIG. 3 illustrates a circuit block diagram 300 of an n to 1 multiplexer which is used in both the conventional glitchless multiplexer (as HFGC_n 108 in FIG. 1) and also the proposed glitchless multiplexer in the illustrative embodiments. In this detailed implementation of MUX 108 in FIG. 1, dly_clk_i 302 and en_i 304 are input signals of the same NAND gate. dly_clk_i 302 is passed to gm_out 306 only when en_i 304 is high. Thus, if gating margins Tgmr2 214 and Tgmf2 216 in FIG. 2 are large enough, there are no problems. However, if clock signals (e.g., clk_1, . . . , clk_i, . . . , clk_n) are used instead of delayed clock signals (e.g., dly_clk_1, . . . , dly_clk_i, . . . , dly_clk_n), the gating margin is Tgmr1 210, which is not large enough. In this case, the pulse widths at the NAND outputs in the dotted oval are narrowed. Consequently, the rising (or falling) edge of gm_out 306 is shaved and the pulse width of gm_out 306 is shorter than that of original input clock clk_i signal. This situation gives a partial clock at gm_out 306. A partial clock is a clock with a stable high and low period which is shorter than that of either of the clocks before and after the switching. A partial clock is not allowed in many circuits in order to prevent malfunction of the system. Circuits which have strict duty (high and low period ratio) restriction include dynamic circuits and custom (analog or array) circuits.

Figure 4:
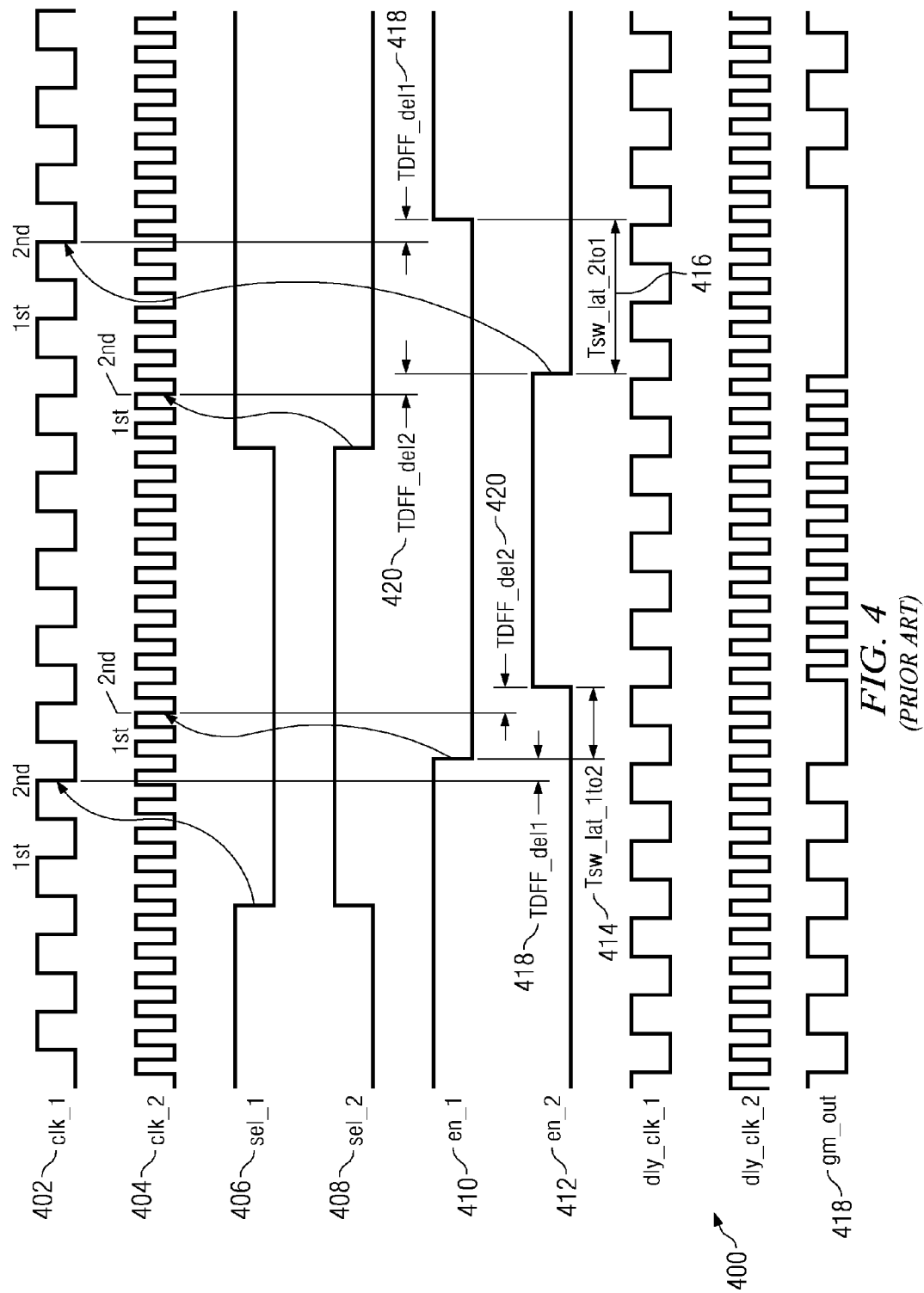
FIG. 4 illustrates a timing diagram for the conventional glitchless clock multiplexer in FIG. 1.

FIG. 4 illustrates a timing diagram 400 for conventional glitchless clock multiplexer 100 in FIG. 1. At the first clock switching from clk_1 402 to clk_2 404 which is triggered by the first switching of sel_1 406 and sel_2 408, en_1 410 signal is de-activated (lowered) at the second falling edge of clk_1 402 after sel_1 406 is de-activated (lowered) and sel_2 408 is activated (raised). Then en_2 412 is activated (raised) at the second falling edge of clk_2 404 after en_1 410 is de-activated (lowered). At the second clock switching from clk_2 404 to clk_1 402, which is triggered by second switching of sel_1 406 and sel_2 408, en_2 412 is de-activated (lowered) at the second falling edge of clk_2 404 after sel_2 408 is de-activated (lowered) and sel_1 406 is activated (raised). Then en_1 410 is activated (raised) at the second falling edge of clk_1 402 after en_2 412 is de-activated (lowered).

In timing diagram 400, the switching latency from clk_1 402 to clk_2 404 is shown as Tsw_lat_1to2 414 and the switching latency from clk_2 404 to clk_1 402 is shown as Tsw_lat_2to1 416, respectively. There is no clock pulse at gm_out 418 during switching latency periods Tsw_lat_1to2 414 and Tsw_lat_2to1 416 because no enable signals, such as en_1 410 and en_2 412, are activated. From timing diagram 400, Tsw_lat_1to2 414 is between one and two clock cycles of clk_2 404 and Tsw_lat_2to1 416 is between one and two clock cycles of clk_1 402, respectively. In other words, conventional glitchless clock multiplexer 100 in FIG. 1 requires at least one clock cycle (and a maximum of two clock cycles) of a slower clock signal. This slower clock signal is defined as the slower clock signal occurring before and after a signal switch. In the case of timing diagram 400, clk_1 402 is slower than clk_2 404. Thus, the Tsw_lat_2to1 416 is larger than Tsw_lat_1to2 414. The maximum and minimum values of the clock switching latency is the maximum and minimum values of Tsw_lat_2to1 416, respectively. These values are one cycle and two cycles of clk_1 402 (slower clock signal), respectively.

$T_{DFF\_del1}$ 418 is the DFF delay in the HFGC block for clk_1 402. $T_{DFF\_del2}$ 420 is the DFF delay in the HFGC block for clk_2 404. Conventional glitchless clock multiplexer 100 in FIG. 1 receives multiple clock signals (clk_1 128, ... clk_i 114, ... clk_n 130) and only one selected clock is passed to the output (gm_out 138). When the selection switches from one clock (clk_i) to another one (clk_j), conventional glitchless clock multiplexer 100 cannot immediately switch because two DFFs (DFF 110 and DFF 112) are cascaded in all HFGC blocks. Generally, glitchless clock multiplexers have the following specific requirements:

(1) a glitchless clock multiplexer must not generate any glitches (partial clock signals) which have shorter stable high or low periods than that of the clock signals before and after the selection of a particular clock signal, and (2) the switching latency of the glitchless clock multiplexer should be as short as possible so that the glitchless clock multiplexer can meet system requirements, such as to minimize the idling period while no clock pulses are supplied. The second requirement depends on the relationship (synchronous or asynchronous) of the two clock signals selected before and after switching. However, as is shown in timing diagram 400 of FIG. 4, a conventional glitchless clock multiplexer requires a switching latency of between one and two clock cycles to ensure non-glitch output regardless of the two clock timing relationship (synchronous or asynchronous). In fact, in the multi-clock system LSI, most of the clocks are categorized into the several synchronous clock groups because those clocks are generated from several synchronous phase lock loops (PLLs) or same clock sources which correspond to the synchronous clock groups.

The illustrative embodiments provide an improved method and system for switching signals using a glitchless clock multiplexer. In the system specification, generally, the timing relationship for the input clock signals of the glitchless clock multiplexer (which clock signals are synchronous or asynchronous) is defined. This information given from the system specification is used to implement the proposed glitchless clock multiplexer which shows optimized performance for synchronous and asynchronous clock multiplexing (switching). In other words, the proposed glitchless clock multiplexer in the illustrative embodiments contributes to the performance optimization of the glitchless clock multiplexer if the input clock sources include both synchronous clocks and asynchronous clocks by categorizing them into some synchronous groups and one asynchronous group. The proposed glitchless clock multiplexer in the illustrative embodiments also contributes to the performance optimization when the required switching latency is very short. A very short switching latency is a latency of one clock cycle or less. The proposed glitchless clock multiplexer in the illustrative embodiments enables switching the clock in one cycle of the slower clock or less.

Figure 5B:
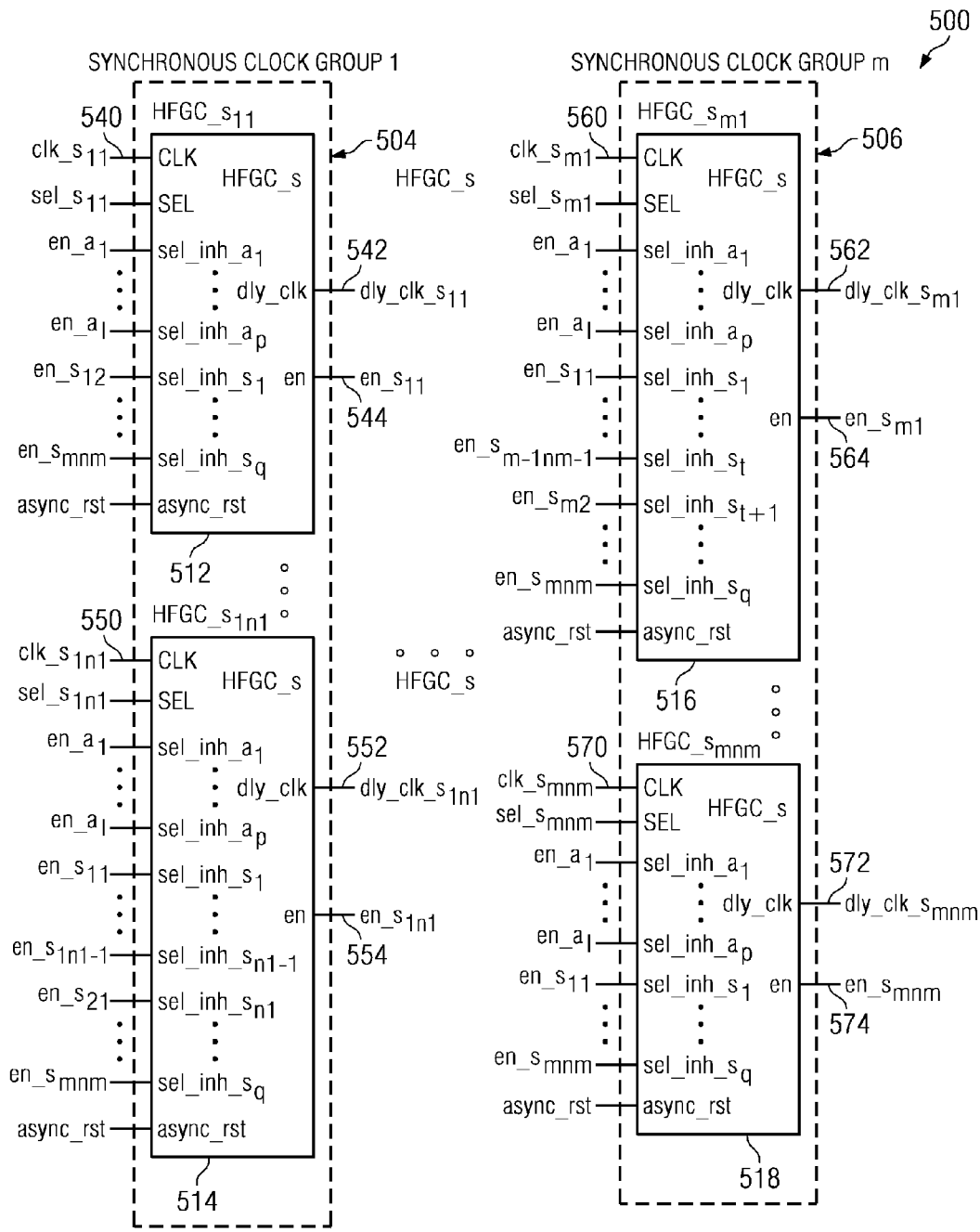
FIGS. 5 (5A and 5B) illustrates a circuit block diagram of a proposed glitchless clock multiplexer in accordance with the illustrative embodiments.

FIGS. 5 (5A and 5B) shows a circuit block diagram of proposed glitchless clock multiplexer 500 in accordance with the illustrative embodiments. In the proposed glitchless clock multiplexer scheme, input clocks are categorized into one asynchronous clock group and any number of synchronous clock groups. In this scheme, the clocks are divided into one asynchronous clock group 502 and m synchronous clock groups (synchronous clock group 1 504 though synchronous clock group m 506), because the glitchless clock multiplexer scheme may comprise one asynchronous clock group and any number of synchronous clock groups. Each clock group comprises one or more high frequency glitchless control blocks. However, the high frequency glitchless control blocks in asynchronous clock group 502 which generate enable and delayed clock signals for asynchronous clock signals are different from the high frequency glitchless control blocks in synchronous clock groups 504 and 506 which generate enable and delayed clock signals for synchronous clock signals. For example, asynchronous clock group 502 contains high frequency glitchless control blocks, HFGC_ai, where i=1, 2, ..., l, and where l is the number of asynchronous clocks. These HFGC_ai blocks are implemented with HFGC_a 600 in FIG. 6. Synchronous clock groups 504 and 506 include high frequency glitchless control blocks HFGC_sjk, where j=1, 2, ..., m, where k=1, 2, ..., $n_j$, where m is the number of synchronous clock groups, and where $n_j$ is the number of synchronous clocks in each synchronous clock group j. These HFGC_sjk blocks are implemented with HFGC_s 700 in FIG. 7.

Conventional glitchless multiplexer 100 in FIG. 1 has only one type of HFGC block (HFGC_1 102, ..., HFGC_i 104, ..., HFGC_n 106). The HFGC block is the same circuit as HFGC_a 600 in FIG. 6. Proposed glitchless multiplexer 500 in FIG. 5 uses this HCGC_a 600 only in the asynchronous clock group 502. Thus, in conventional glitchless multiplexer 100 in FIG. 1, all of the clocks are treated as asynchronous even if some of them are synchronous. With HFGC blocks (e.g., 102, 104, 106, etc.), at least one (maximum two) clock cycle of the input clock is required as the switching latency. This is in contrast with proposed glitchless multiplexer 500 in FIG. 5, where the switching latency inside the same synchronous group (e.g., 504 and 506 in the circuit 500) is less than one clock cycle of the input clock.

Thus, for high frequency glitchless control blocks in asynchronous clock group 502 (e.g., HFGC_a1 508, HFGC_al 510, etc.), clock signals (e.g., clk_a1 520, clk_al 530, etc.) are supplied to the clock input port (clk) of the respective control blocks. The delayed clock signals dly_clk_ai (i=1, 2, ..., l) (e.g., dly_clk_a1 526, dly_clk_al 532, etc.) generated by HFGC_ai (i=1, 2, ..., l) (e.g., HFGC_a1 508, HFGC_al 510, etc.) are then supplied to MUX 580 as dly_clk_ai (i=1, 2, ..., l) 582. The enable signals en_ai (i=1, 2, ..., l) (e.g., en_a1 528, en_al 534, etc.) generated by HFGC_ai (i=1, 2, ..., l) (e.g., HFGC_a1 508, HFGC_al 510, etc.) are also supplied to MUX 580 as en_ai (i=1, 2, ..., l) 586.

For the synchronous clock groups including groups 504 and 506, high frequency glitchless control blocks (e.g., HFGC_s11 512, HFGC_s1$n_1$ 514, HFGC_sm1 516, HFGC_smn$_m$ 518, etc.) receive corresponding clock signals (e.g., clk_s11 540, clk_s1$n_1$ 550, clk_sm1 560, clk_smn$_m$ 570, etc.) at their clk input ports. The delayed clock signals dly_clk_sjk (j=1, 2, ..., m; k=1, 2, ..., $n_j$) (e.g., dly_clk_s11 542, dly_clk_s1$n_1$ 552, dly_clk_sm1 562 and dly_clk_smn$_m$ 572, etc.) generated by high frequency glitchless control blocks HFGC_sjk (j=1, 2, ..., m; k=1, 2, ..., $n_j$) (e.g., HFGC_s11 512, HFGC_s1$n_1$ 514, HFGC_sm1 516 and HFGC_smn$_m$ 518, etc.) in the synchronous clock groups (e.g., 504, 506, etc.) are supplied to MUX 580. The en_sjk signals (e.g., en_s11 544, en_s1$n_1$ 554, en_sm1 564, en_smn$_m$ 574, etc.) generated by the high frequency glitchless control blocks HFGC_sjk (e.g., 512, 514, 516, 518, etc.) in the synchronous clock groups (e.g., 504, 506, etc.) are supplied to MUX 580 as en_sjk (j=1, 2, ..., m; k=1, 2, ..., $n_j$) 588. These enable signals en are also supplied to select inhibit ports (sel_inh_a1, ..., sel_inh_ap, sel_inh_s1, ..., sel_inh_sq) of the HFGC_a (e.g., 508, 510) and HFGC_s (e.g., 512, 514, 516, 518) blocks except to the block the enable signal generated. For example, en_s1$n_1$ 554 is supplied to HFGC blocks 508, 510, 512, 516, 518, etc., however, it is not supplied to HFGC_s1$n_1$ 514.

At this point, the delayed input clock signals represented by dly_clk_ai 582 from asynchronous clock group 502 and the delayed input clock signals represented by dly_clk_sjk 584 from synchronous clock groups 504, 506, etc. are supplied to MUX 580. MUX 580 selects one of the delayed clock signals using the enable signals represented by en_ai (i=1, 2, ..., l) 586 and en_sjk (j=1, 2, ..., m; k=1, 2, ..., $n_j$) 588 for the output at gm_out 590 in the same manner as the multiplexer 108 in the conventional glitchless clock multiplexer 100 shown in FIG. 1 selects one clock signal for output at gm_out 138.

Figure 6:
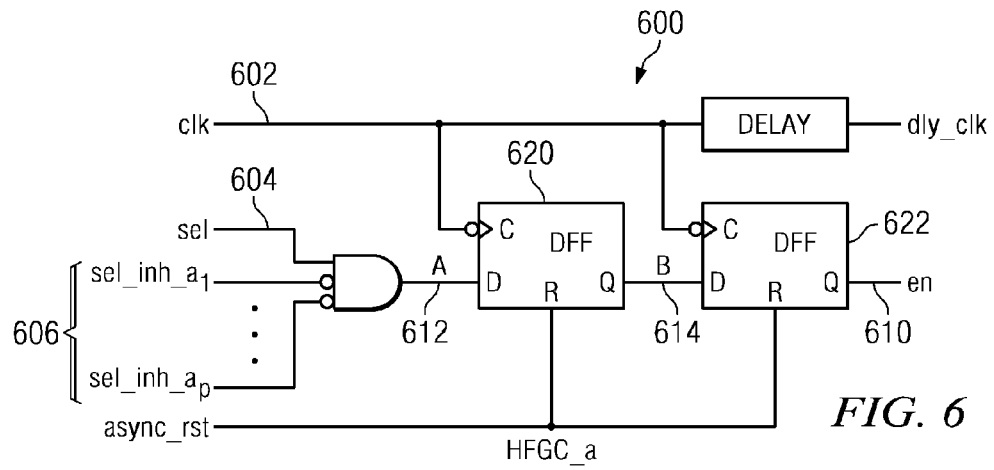
FIG. 6 illustrates a circuit block diagram illustrating an exemplary high frequency glitchless control block for asynchronous clock switching (HFGC_a) in accordance with the illustrative embodiments.

FIG. 6 shows a circuit block diagram of an exemplary high frequency glitchless control block 600 for asynchronous clock switching in accordance with the illustrative embodiments. In particular, high frequency glitchless control block 600 is a detailed view of the high frequency glitchless control blocks HFGC_ai (i=1, 2, ..., l) in asynchronous clock group 502 in FIG. 5 (e.g., HFGC_a1 508, HFGC_al 510, etc.)

HFGC_a 600 is used as HFGC_ai (i=1, 2, ..., l) 508, ..., 510 in FIG. 5 as described. In HFGC_a 600, signal node A 612 is activated to high level when selection signal sel 604 is activated and all of the selection inhibit signal sel_inh_ai (i=1, 2, ..., p) signals 606 are not activated (stay low level). Only in this condition is signal node A 612 activated to high level, and the high level is captured in cascaded two stage DFFs (DFF 620 and DFF 622) at the falling edge timing of clock signal clk 602. Signal node B 614 is activated to high level when one falling edge in clk 602 is supplied to DFF 620 after signal node A 612 is activated to high level. So enable signal en 610 is activated to high level when two falling edges in clk 602 are supplied to DFFs (DFF 620 and DFF 622) after signal node A 612 is activated to high level. Clock signal clk_a1 520 and select signal sel_a1 522 in HFGC_a1 508 in FIG. 5 are connected to clk 602 port and sel 604 port of HFGC_a block 600 in FIG. 6, respectively. The enable signals en_ai (i=2, ..., l) and en_sjk (j=1, 2, ..., m; k=1, 2, ..., $n_j$) which are shown as group of enable signals 524 are connected to sel_inh_ai (i=1, 2, ..., p) 606 ports. The enable signals 524 consist of enable signals 586 except en_1 and enable signals 588. The en_a1 signal 528 is generated by HFGC_a1 508. Generally, all of the HFGC blocks receive all of the enable signals except one enable signal which is generated by its own block. Thus, these connections are the same for other HFGC_ai blocks (i=2, 3, ..., l) (e.g., HFGC_al 510) within asynchronous clock group 502 in the block 500 shown in FIG. 5.

The enable signal for the clock which will be selected next is generated at en 610 port of HFGC_a block 600 in FIG. 6. All of the other enable signals are connected to select inhibit ports 606 of HFGC_a block 600 in FIG. 6. These connections keep enable signal for next selected clock from being de-activated until the enable signals for all other clocks are de-activated in order to avoid clock signal collision at MUX 580 in FIG. 5. If clk_a1 520 (dly_clk_a1 526) will be selected next, en_a1 528 will be activated (raised to high level) after all other enable signals (e.g., en_al 534, en_s11 544, en_s1$n_1$ 554, en_sm1 564, en_smn$_m$ 574 etc.) are de-activated (lowered to low level). Thus, high frequency glitchless control block (HFGC_a) 600 generates enable signal en 610 which can avoid signal collision at output gm_out 590 in glitchless clock multiplexer 500 in FIG. 5.

Figure 7:
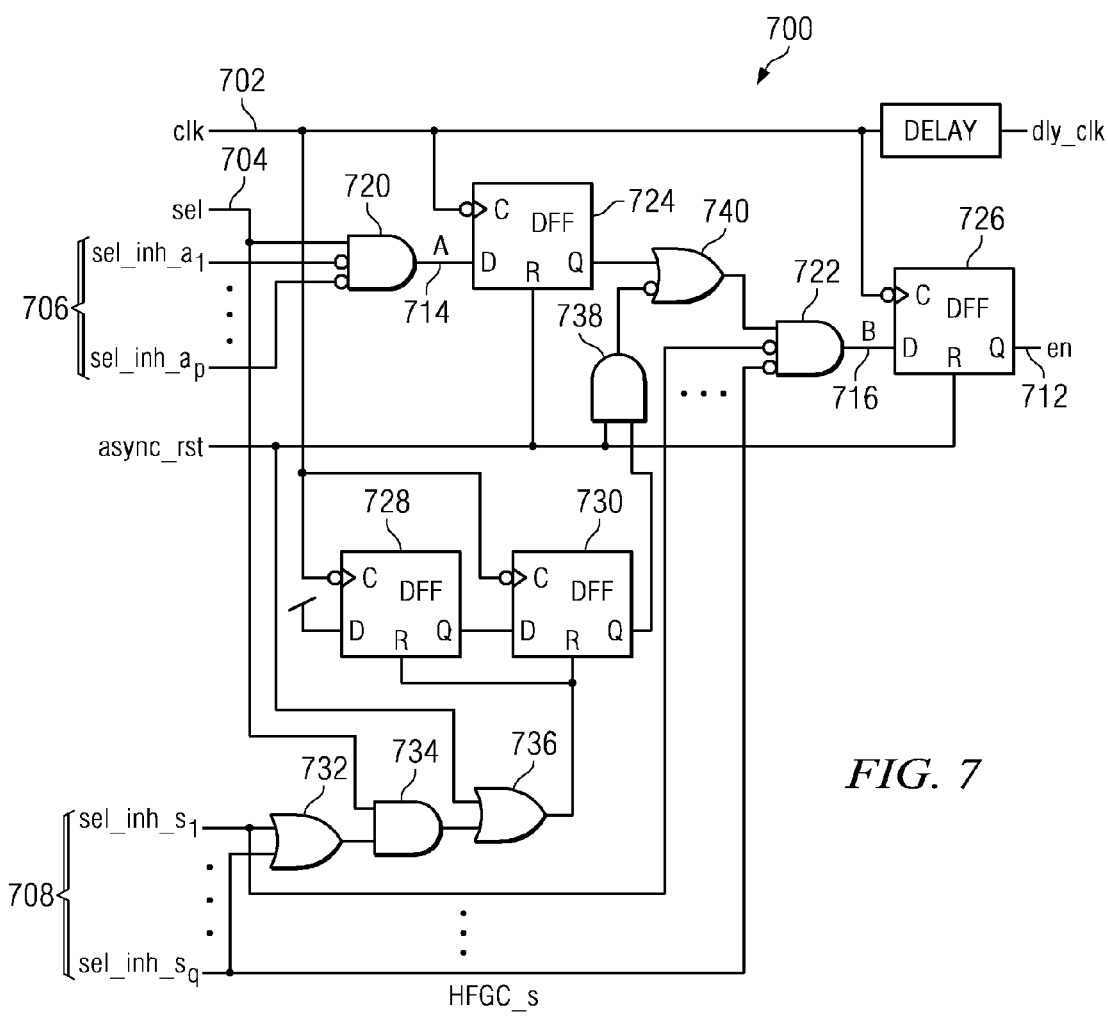
FIG. 7 illustrates a circuit block diagram illustrating an exemplary high frequency glitchless control block for synchronous clock switching (HFGC_s) in accordance with the illustrative embodiments.

FIG. 7 is a circuit block diagram illustrating an exemplary high frequency glitchless control block 700 for synchronous clock switching in accordance with the illustrative embodiments. In particular, high frequency glitchless control block (HFGC_s) 700 is a detailed view of the high frequency glitchless control blocks HFGC_sjk (j=1, 2, ..., m; k=1, 2, ..., $n_j$) in synchronous clock groups 1 504 through m 506 in FIG. 5 (e.g., HFGC_s11 512, HFGC_s1$n_1$ 514, HFGC_sm1 516, and HFGC_smn$_m$ 518, etc.).

Clock signal (clk 702), select signal of clk (sel 704), and the select inhibit signals (sel_inh_ai (i=1, 2, ..., p) 706 and sel_inh_sj (j=1, 2, ..., q) 708) are used as the input signals of high frequency glitchless control block (HFGC_s) 700. In HFGC_s 700, all of the operations performed are the same as those of HFGC_a 600 in FIG. 6, except for the clock switching inside the same synchronous clock group. In order to switch the clock, the de-activated timing of the enable signal for the previous clock which is triggered by the previous clock has to be captured by the DFF(s) in the high frequency glitchless control block for the following clock.

According to the clock groups in which previous and following clock signals for switching are included, the clock switching (multiplexing) is categorized into the following four cases: Case 1—switching between the different two clock signals inside the same synchronous group; Case 2—switching between the clock signal in the asynchronous group and the clock signal in one of the synchronous groups; Case 3—switching between the clock signal in one of the synchronous groups and the clock signal in one of the other synchronous groups; Case 4—switching between the different two clock signals inside the asynchronous group. Therefore, when clock switching happens within the same synchronous clock group (Case 1), the possibility of a meta-stable state occurring during the clock switching is extremely low compared with the case of clock switching across different clock groups (Case 2 or Case 3) (between asynchronous group and one of synchronous groups (Case 2) or between different synchronous groups (Case 3)) or inside an asynchronous group (Case 4), since there is very little possibility for clock changes while the DFFs' input, output, or internal nodes are changing if the two switching clocks are synchronous (Case 1). If switching occurs between an asynchronous group and one of the synchronous groups (Case 2), between different synchronous groups (Case 3), or inside an asynchronous group (Case 4), this meta-stable state possibility is much more than that of Case 1. Thus, one of the D flip flops (DFF 724) in the cascading path is bypassed which reduces the maximum switching latency within a same synchronous group switching down to one cycle.

To reduce the latency for clock switching inside the same synchronous clock group (Case 1) in HFGC_s 700, sel_inh_sj (j=1, 2, ..., q) 708 are connected not to combinational gate 720, but rather to appended combinational gate 722. The output of gate 720 is connected to signal node A 714 and from which signal node A passes through two DFFs (724 and 726) to reach enable signal en 712. On the other hand, the output of gate 722 is connected to signal node B 716 and from which signal node B passes through only one DFF 726 to reach enable signal en 712. Thus, the switching latency inside the same synchronous group (Case 1) is reduced by one clock cycle compared with other cases (Case 2, Case 3 and Case 4). Besides gate 722, the DFF 728 and DFF 730 together with several combinational gates (732, 734, 736, 738 and 740) are also added to HFGC_a 600 in FIG. 6 in order to implement HFGC_s 700 in FIG. 7. The sel_inh_sj 708 (j=1, 2, ..., q) are connected to other enable signals in the same synchronous group in circuit 500 in FIG. 5. The direct connection of sel_inh_sj 708 (j=1, 2, ..., q) to gate 722 means that the enable signal en 712 is generated in one clock cycle or less after other enable signals in the same synchronous group are all de-activated. Thus, HFGC_s circuit 700 enables the switching latency reduction for Case 1. HFGC_s circuit 700 also has a function for initializing the internal state determined by DFFs (724 and 726) with DFFs (728 and 730) and combinational gates (732, 734, 736, 738 and 740). The clock switching across different clock groups (Case 2 and Case 3) are treated in the same way as the clock switching inside asynchronous group (Case 4). Therefore, the enable signals from en_s21 to en_smn$_m$ are connected from sel_inh_al+1 to sel_inh_ap ports of HFGC_s11 512 block in FIG. 5. This is true for other HFGC_sjk (j=1, 2, ..., m; k=1, 2, ..., n$_j$) blocks (514, 516, 518, etc.).

Figure 8:
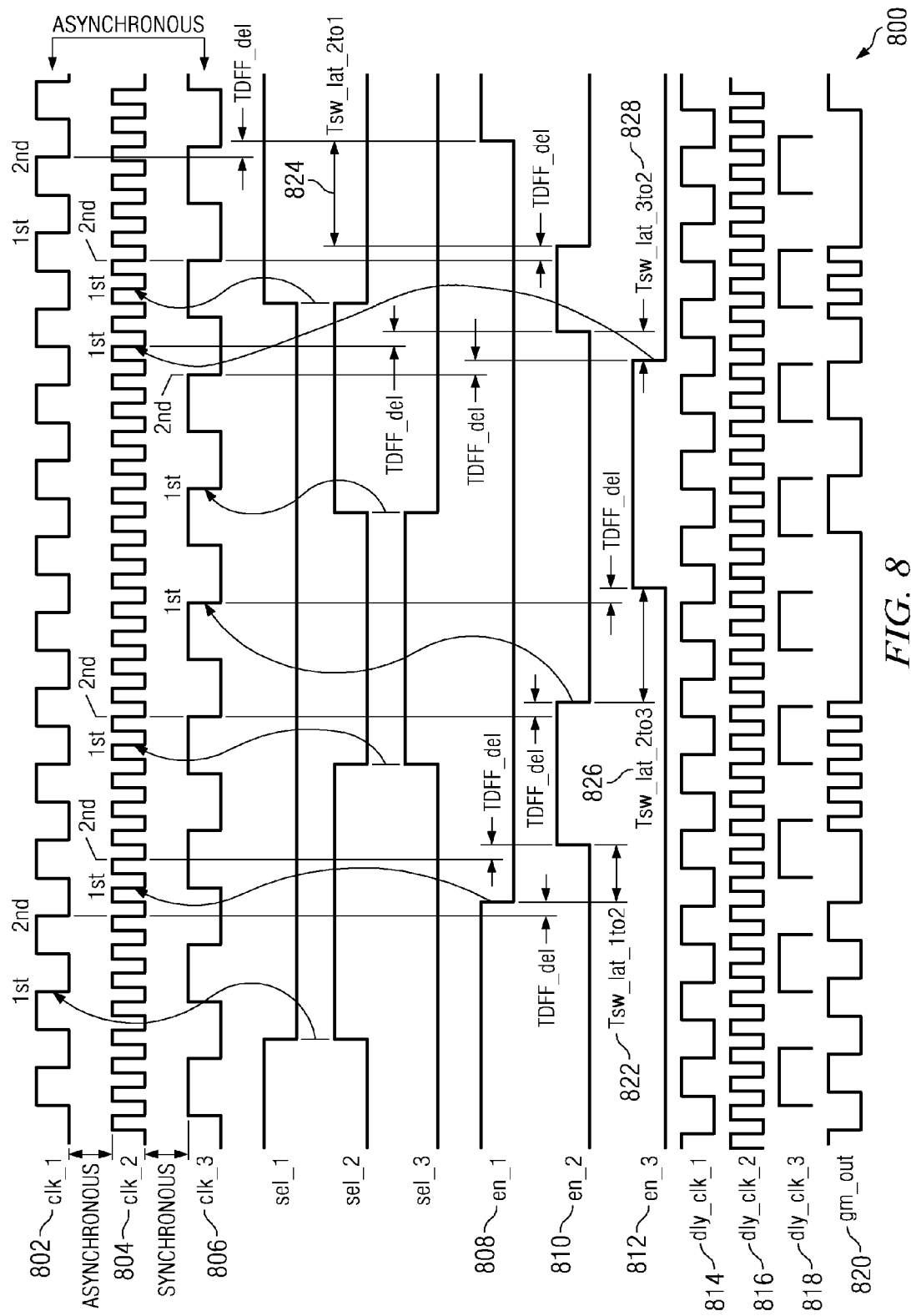
FIG. 8 illustrates a timing diagram for the proposed glitchless clock multiplexer in FIG. 5 in accordance with the illustrative embodiments.

FIG. 8 shows timing diagram 800 of proposed glitchless multiplexer 500 in FIG. 5. In timing diagram 800, clk_1 802 is in an asynchronous group and clk_2 804 and clk_3 806 are in the same synchronous group. As the delayed clock signals are generated with almost the same delay in corresponding HFGC blocks, dly_clk_1 814 is asynchronous with both dly_clk_2 816 and dly_clk_3 818. On the other hand, dly_clk_2 816 and dly_clk_3 818 are synchronous with each other. The clock switching sequence is clk_1 802, clk_2 804, clk_3 806, clk_2 804, clk_1 802.

A clock switching latency Tsw_lat_itoj is defined as the gap between two enable signals en_i and en_j when the switching between clk_i and clk_j occurs. During this period, no clock pulses are generated at gm_out 820. As for the asynchronous clock switching from clk_1 802 to clk_2 804, the enable signal for the new clock (en_2 810) is activated at the second falling edge of the new clock (clk_2 804) after the enable signal for the old clock (en_1 808) is de-activated. Thus, the switching latency from clk_1 802 to clk_2 804 (Tsw_lat_1to2 822) which is defined as the gap of activated en_1 808 and activated en_2 810 period is between one and two clock cycles of clk_2 804. In the same manner, the clock switching latency from clk_2 804 to clk_1 802 (Tsw_lat_2to1 824) which is defined as the gap of activated en_2 810 and activated en_1 808 period is between one and two clock cycles of clk_1 802.

As for the clock switching in the same synchronous group from clk_2 804 to clk_3 806, all of the falling edges of slower clock (clk_3 806) are aligned to those of faster clock (clk_2 804). The transition of en_2 810 and en_3 812 is triggered by falling edges of clk_2 804 and clk_3 806, respectively, with small DFF delay $T_{DFF\_del}$. $T_{DFF\_del}$ is the DFF delay in all HFGC blocks. The enable signal for the new clock (en_3 812) is activated at the first falling edge of the new clock (clk_3 806) after the enable signal for the old clock (en_2 810) is de-activated. Thus, the clock switching latency from clk_2 804 to clk_3 806 (Tsw_lat_2to3 826) which is defined as the gap of activated en_2 810 and activated en_3 812 period is less than one cycle of clk_3 806. In the same manner, the clock switching latency from clk_3 806 to clk_2 804 (Tsw_lat_3to2 828) which is defined as the gap of activated en_3 812 and activated en_2 810 period is less than one cycle of clk_2 804. In this example, the cycle of clk_2 804 is shorter than that of clk_3 806 (clk_3 806 is slower than clk_2 804), so the maximum switching latency between clk_2 804 and clk_3 806 is not Tsw_lat_3to2 828, but rather Tsw_lat_2to3 826. In addition, the maximum clock switching latency value is one cycle of slower clock (clk_3 806). In other words, the maximum clock switching latency between the clocks within the same synchronous group is one clock cycle of the slower clock (e.g., clk_3 806 in timing diagram 800).

Figure 9:
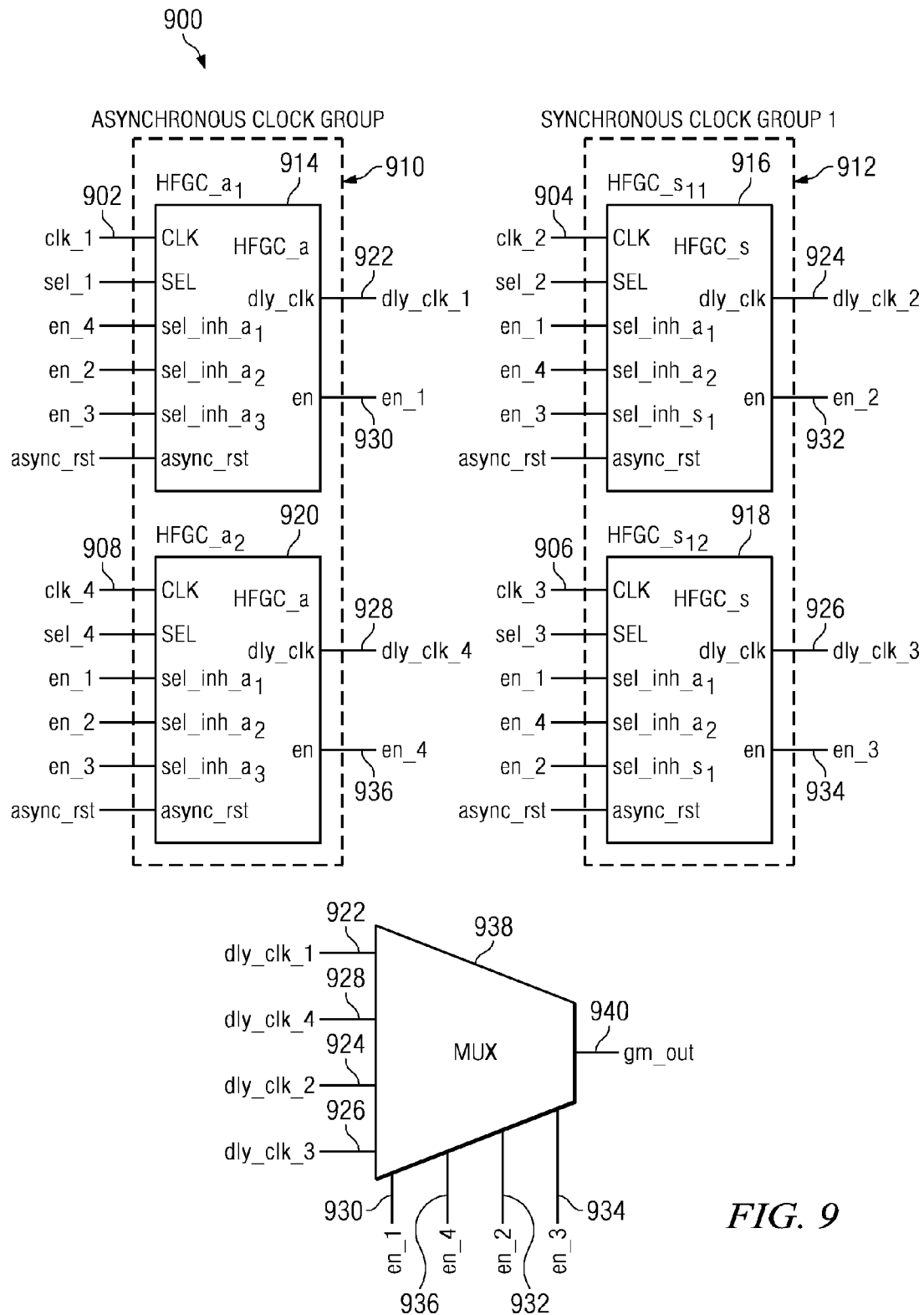
FIG. 9 illustrates a circuit block diagram illustrating an example of a glitchless clock multiplexer optimized for asynchronous and synchronous clocks in accordance with the illustrative embodiments.

FIG. 9 is a circuit block diagram illustrating an example of a glitchless clock multiplexer optimized for asynchronous and synchronous clocks in accordance with the illustrative embodiments. In this example circuit 900, four different input clocks, clk_1 902, clk_2 904, clk_3 906, and clk_4 908, are used. clk_1 902 and clk_4 908 have been categorized into asynchronous clock group 910 and clk_2 904 and clk_3 906 have been categorized into one same synchronous clock group i (i=1) 912. High frequency glitchless control blocks HFGC_a1 914 and HFGC_a2 920 are within asynchronous clock group 910, and HFGC_s11 916 and HFGC_s12 918 are within a same synchronous clock group 912. As clk_2 904 and clk_3 906 are in the same synchronous clock group 912, clk_2 904 and clk_3 906 are synchronous each other. In contrast, any two clocks out of clk_1 902, clk_2 904, and clk_4 908 are completely asynchronous with each other.

The delayed clock signals (dly_clk_1 922, dly_clk_2 924, dly_clk_3 926, dly_clk_4 928) and enable signals (en_1 930, en_2 932, en_3 934, en_4 936) generated from the high frequency glitchless control blocks (914, 916, 918, 920) are supplied to MUX 938. MUX 938 passes only one of the delayed clock signals to the output gm_out 940 using the enable signals en_1 930, en_2 932, en_3 934 and en_4 936 in the same manner as conventional glitchless clock multiplexer 100 in FIG. 1 selects (passes) one of the clock signals for output at gm_out 138.

Figure 10:
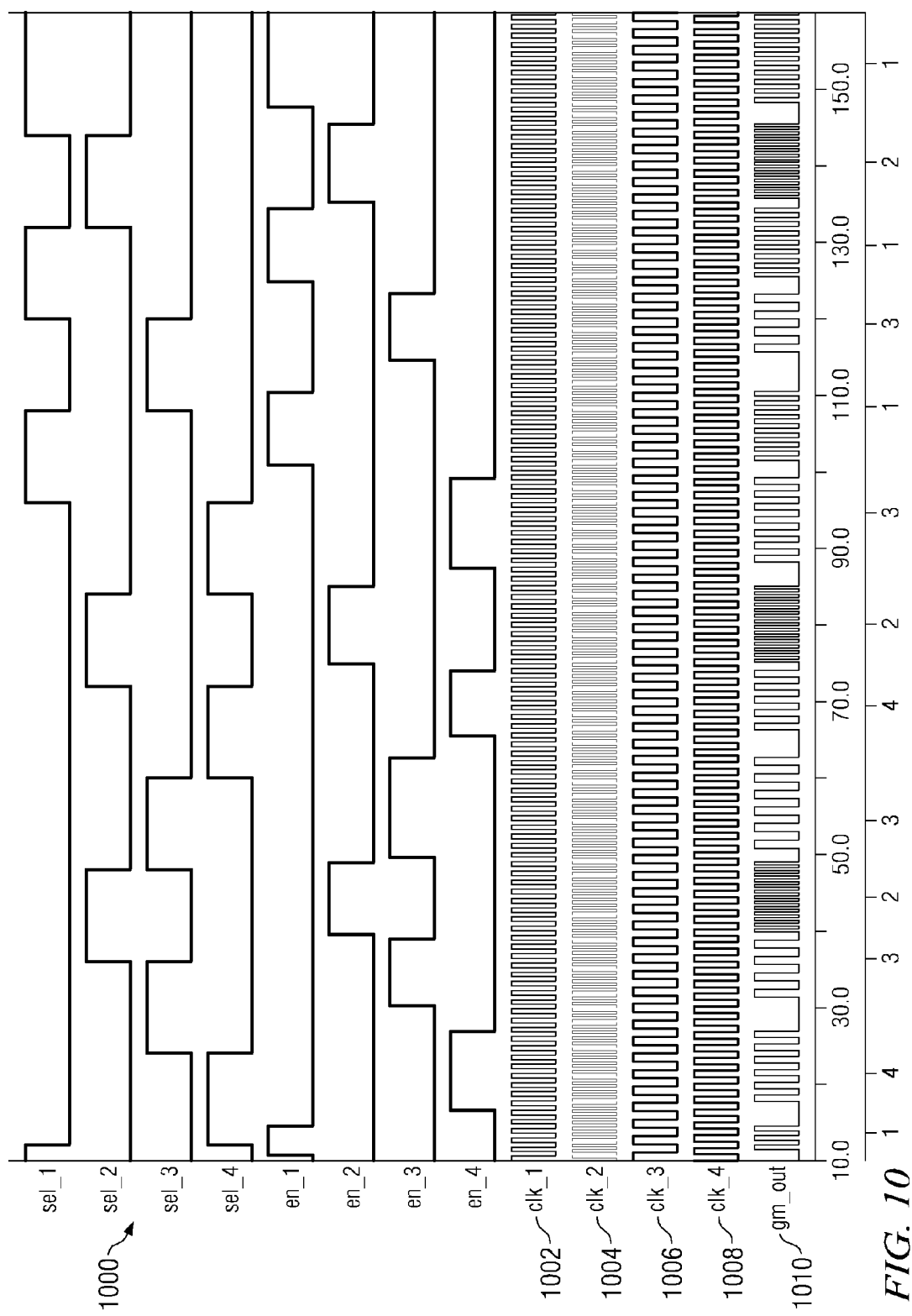
FIG. 10 is a diagram illustrating simulation waveforms of the proposed glitchless clock multiplexer in FIG. 9 in accordance with the illustrative embodiments.

FIG. 10 is a diagram illustrating simulation waveforms 1000 for circuit 900 in FIG. 9 in accordance with the illustrative embodiments. In particular, waveforms 1000 include the input waveforms of the select (sel_i), enable (en_i), and clock (clk_i) signals and the output waveform (gm_out) of the glitchless clock multiplexer. As can be seen in gm_out 1010 waveform, when switching occurs within a same synchronous group, illustrated as clk_2 1004 waveform and clk_3 1006 waveform, circuit 900 in FIG. 9 requires only one clock cycle of the new clock or less for the switching. In all of other switching cases (such as from clk_1 1002 to clk_4 1008, from clk_4 1008 to clk_3 1006, from clk_3 1006 to clk_4 1008, from clk_4 1008 to clk_2 1004, etc.), the switching occurs between asynchronous clocks. From waveforms 1000 in FIG. 10, circuit 900 in FIG. 9 requires between one and two clock cycles of the new clock for the asynchronous clock switching.

Figure 11:
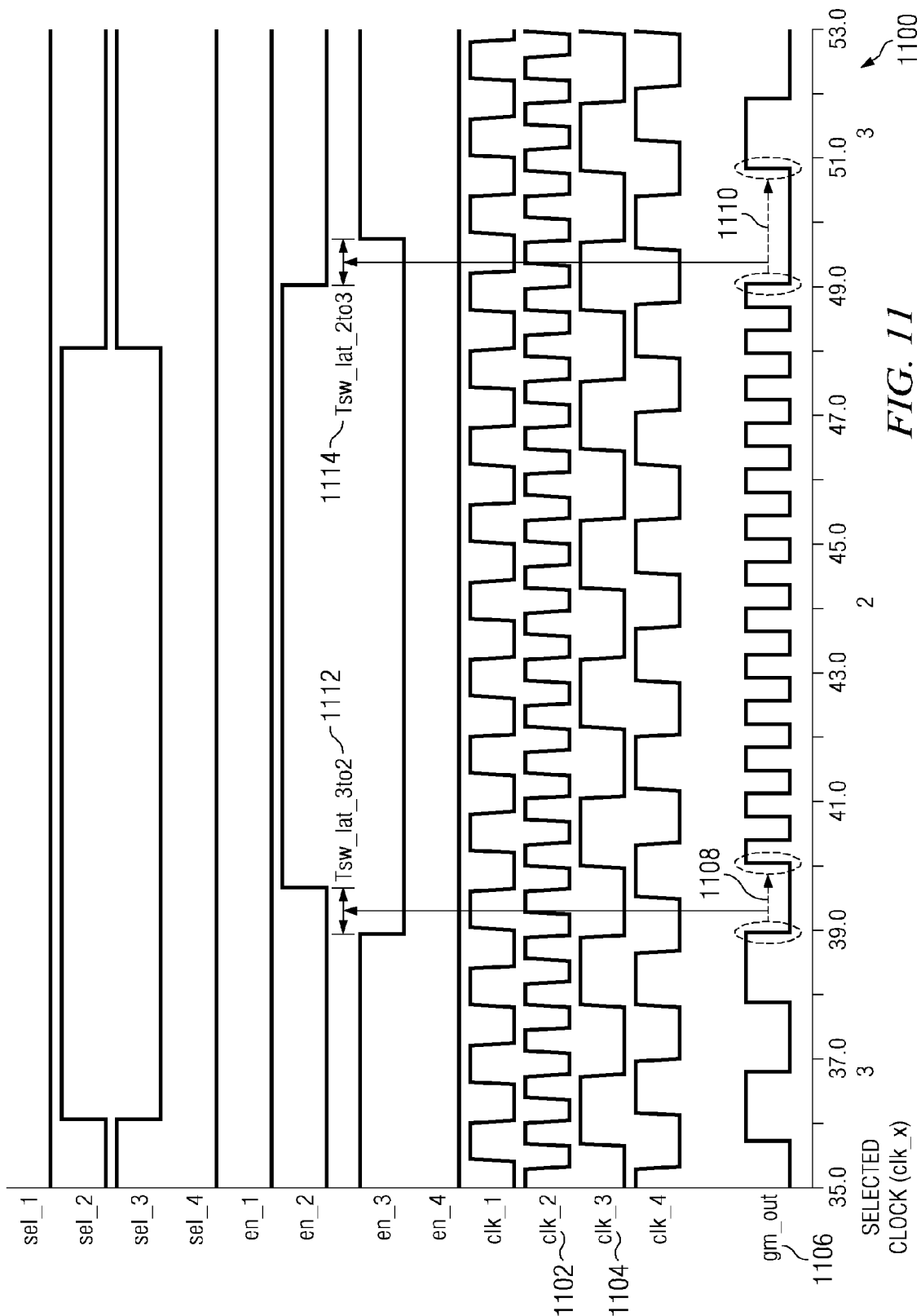
FIG. 11 is a diagram illustrating magnified simulation waveforms of the waveforms in FIG. 10 in accordance with the illustrative embodiments.

FIG. 11 is a diagram illustrating magnified simulation waveforms 1100 of waveforms 1000 in FIG. 10 for circuit 900 in FIG. 9 in accordance with the illustrative embodiments. In particular, FIG. 11 illustrates a magnified waveform for the synchronous clock switching between clk_2 1102 and clk_3 1104 between time 35 (ns) to 53 (ns) of waveforms 1000 in FIG. 10 for circuit 900 in FIG. 9. As can be seen in gm_out 1106 waveform, when switching 1108 (from clk_3 1104 to clk_2 1102) occurs between clk_2 1102 and clk_3 1104 in the same synchronous group, circuit 900 in FIG. 9 requires clock switching latency of Tsw_lat_3to2 1112. Tsw_lat_3to2 1112 is one clock cycle of new clock (clk_2 1102) or less. When switching 1110 (from clk_2 1102 to clk_3 1104) occurs, circuit 900 requires clock switching latency of Tsw_lat_2to3 1114. Tsw_lat_2to3 1114 is one clock cycle of new clock (clk_3 1104) or less.

Figure 12:
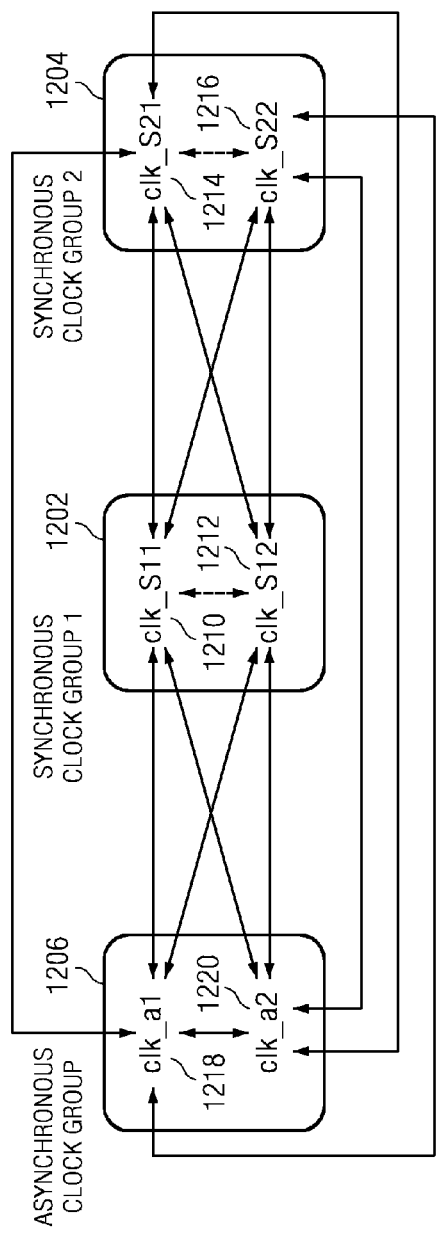
FIG. 12 is a diagram illustrating a relationship (asynchronous or synchronous) between any of two clocks in an asynchronous and two synchronous clock groups in accordance with the illustrative embodiments.

FIG. 12 is a diagram 1200 illustrating the relationship between synchronous and asynchronous clock signals in the proposed glitchless clock multiplexer in accordance with the illustrative embodiments. In particular, the relationship between or among two or more clocks determines whether the clocks are synchronous or asynchronous. 'Synchronous' always indicates the relationship between or among clocks whose rising or falling edges appear at the same time once in one or some clock cycles periodically. Such clock signals are categorized into the same synchronous group, such as between clk_s11 1210 and clk_s12 1212 in Synchronous Clock Group 1 1202, and between clk_s21 1214 and clk_s22 1216 in Synchronous Clock Group 2 1204. 'Asynchronous' relationship always indicates the relationship except 'Synchronous' relationship mentioned above. This includes (1) the relationship between or among clocks that are included in different synchronous groups (e.g., one in Synchronous Clock Group 1 1202 and another in Synchronous Clock Group 2 1204) even though the clocks are both or all in synchronous clock groups (1202 and 1204), (2) the relationship between or among clocks all in the Asynchronous Clock Group 1206, and (3) the relationship between or among clocks in the Asynchronous Clock Group 1206 and one or more synchronous clock group(s) (1202 or/and 1204). Thus, for example, (1) clk_s11 1210 in Synchronous Clock Group 1 1202 and clk_s21 1214 in Synchronous Clock Group 2 1204 are asynchronous, (2) clk_a1 1218 and clk_a2 1220 both in Asynchronous Clock Group 1206 are asynchronous, and (3) clk_a1 1218 in Asynchronous Clock Group 1206 and clk_s11 1210 in Synchronous Clock Group 1 1202 and clk_s22 1216 in Synchronous Clock Group 2 1204 are all asynchronous. According to this definition, there is only one asynchronous clock group in the proposed glitchless clock multiplexer because all of the clocks which do not have a pair of synchronous relationship can be categorized into one group, that is, Asynchronous Clock Group 1206.

Figure 13:
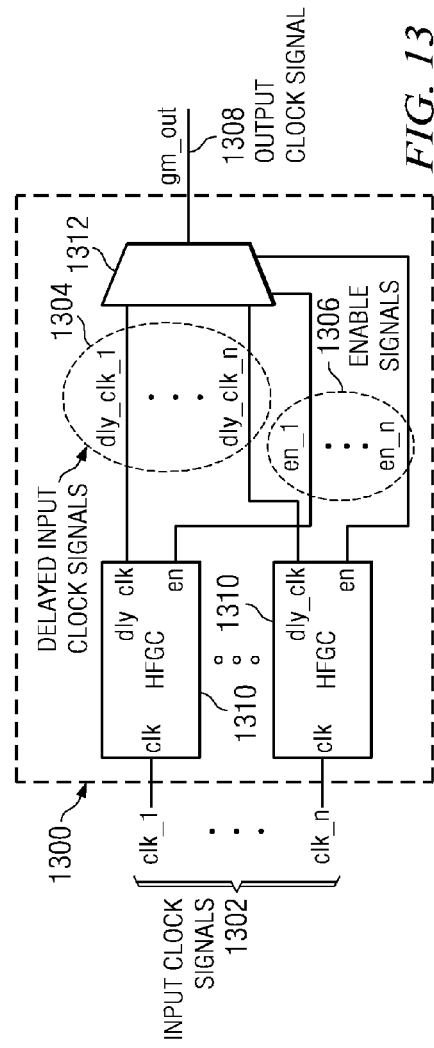
FIG. 13 is a diagram illustrating a simplified block diagram of the glitchless clock multiplexer in accordance with the illustrative embodiments.

FIG. 13 illustrates the simplified block diagram of a glitchless clock multiplexer 1300 in accordance with the illustrative embodiments. Globally, the glitchless clock multiplexer receives Input Clock Signals 1302. However, the internal multiplexer (MUX) 1312 locally receives Delayed Input Clock Signals 1304 which are generated by HFGC blocks 1310 from the Input Clock Signals 1302. Because the switching latency is defined as the performance of the glitchless clock multiplexer, they are defined not with Delayed Input Clock Signals 1304 but with the Input Clock Signals 1302. Enable Signals 1306 are generated by the HFGC blocks 1310 from the Input Clock Signals 1302. Output Clock Signal 1308 is generated directly by the internal multiplexer (MUX) 1312 from the Delayed Input Clock Signals 1304 and the Enable Signals 1306.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit for managing clock signal switching with logic devices, comprising:
    an asynchronous clock group comprising one or more glitchless control blocks for outputting asynchronous clock signals;
    one or more synchronous clock groups comprising a plurality of glitchless control blocks for outputting synchronous clock signals; and
    a multiplexer for receiving delayed input clock signals from the glitchless control blocks for outputting asynchronous clock signals and delayed input clock signals from the glitchless control blocks for outputting synchronous clock signals;
    wherein a switching latency from a first input clock signal which belongs to a synchronous clock group in the one or more synchronous clock groups to a second input clock signal which belongs to the synchronous clock group is one clock cycle or less of the second input clock signal;
    wherein the switching latency is a period in which no clock pulse appears at a final output clock signal of the circuit; and
    wherein select inhibit terminals in each glitchless control block for the synchronous clock group are connected directly to a combinational gate in each glitchless control block, such that an output signal from the combinational gate passes through only one D flip-flop to generate an enable signal one cycle earlier than other switching cases in which the output signal from the combinational gate passes through at least two stages of D flip-flops.

2. The circuit of claim 1, wherein the switching latency is one clock cycle or less of a second input clock.

3. The circuit of claim 1, wherein a switching latency from a first input clock signal which belongs to a synchronous clock group to a second input clock signal which belongs to the asynchronous clock group is between one and two clock cycles of the second input clock signal.

4. The circuit of claim 1, wherein a switching latency from a first input clock signal which belongs to the asynchronous clock group to a second input clock signal which belongs to a synchronous clock group is between one and two clock cycles of the second input clock signal.

5. The circuit of claim 1, wherein a switching latency from a first input clock signal which belongs to a synchronous clock group to a second input clock signal which belongs to a different synchronous clock group is between one and two clock cycles of the second input clock signal.

6. The circuit of claim 1, wherein a switching latency from a first input clock signal which belongs to the asynchronous clock group to a second input clock signal which also belongs to the asynchronous clock group is between one and two clock cycles of the second input clock signal.

7. The circuit of claim 1, wherein the first input clock signal comprises a first input logic signal and the second input clock signal comprises a second input logic signal.

8. A computer implemented method for managing clock signal switching with logic devices in a circuit, comprising:
    receiving, at a multiplexer, delayed input clock signals from one or more glitchless control blocks for outputting asynchronous clock signals in an asynchronous clock group and delayed input clock signals from a plurality of glitchless control blocks for outputting synchronous clock signals in one or more synchronous clock groups; and switching from a first input clock signal which belongs to a synchronous clock group in the one or more synchronous clock groups to a second input clock signal which belongs to the synchronous clock group, wherein a switching latency from the first input clock signal which belongs to the synchronous clock group to the second input clock signal which belongs to the synchronous clock group is one clock cycle or less of the second input clock signal, and wherein the switching latency is a period in which no clock pulse appears at a final output clock signal of the circuit; and wherein select inhibit terminals in each glitchless control block for the synchronous clock group are connected directly to a combinational gate in each glitchless control block, such that an output signal from the combinational gate passes through only one D flip-flop to generate an enable signal one cycle earlier than other switching cases in which the output signal from the combinational gate passes through at least two stages of D flip-flops.

9. The computer implemented method of claim 8, wherein the switching latency is one clock cycle or less of a second input clock.

10. The computer implemented method of claim 8, wherein a switching latency from a first input clock signal which belongs to a synchronous clock group to a second input clock signal which belongs to the asynchronous clock group is between one and two clock cycles of the second input clock signal.

11. The computer implemented method of claim 8, wherein a switching latency from a first input clock signal which belongs to the asynchronous clock group to a second input clock signal which belongs to a synchronous clock group is between one and two clock cycles of the second input clock signal.

12. The computer implemented method of claim 8, wherein a switching latency from a first input clock signal which belongs to a synchronous clock group to a second input clock signal which belongs to a different synchronous clock group is between one and two clock cycles of the second input clock signal.

13. The computer implemented method of claim 8, wherein a switching latency from a first input clock signal which belongs to the asynchronous clock group to a second input clock signal which also belongs to the asynchronous clock group is between one and two clock cycles of the second input clock signal.

14. The computer implemented method of claim 8, wherein the first input clock signal comprises a first input logic signal and the second input clock signal comprises a second input logic signal.

* * * * *